United States Patent [19]

Kondo

[11] 4,285,457

[45] Aug. 25, 1981

[54] APPARATUS FOR SOLDERING PRINTED CIRCUIT BOARDS

[76] Inventor: Kenshi Kondo, c/o Nihon Dennetsu Keiki Kabushiki Kaisha, No. 27-1, Shimomaruko 2-chome, Ohta-ku, Tokyo, Japan

[21] Appl. No.: 104,722

[22] Filed: Dec. 18, 1979

[30] Foreign Application Priority Data

Feb. 19, 1979 [JP]  Japan .................................. 54/17262

[51] Int. Cl.³ ............................................... B23K 1/08
[52] U.S. Cl. ........................................ 228/36; 228/40; 228/43; 228/259; 228/260; 198/342; 134/83
[58] Field of Search ............... 228/179, 180 R, 180 A, 228/185, 256, 259, 260, 36, 37, 40, 43, 47, 49 R; 198/342; 134/49, 83, 125, 165

[56] References Cited

U.S. PATENT DOCUMENTS

| | | | |
|---|---|---|---|
| 3,000,342 | 9/1961 | Dorosz et al. | 228/40 |
| 3,828,419 | 8/1974 | Wanner | 228/40 X |

*Primary Examiner*—Richard B. Lazarus

*Attorney, Agent, or Firm*—Stephen F. K. Yee

[57] ABSTRACT

An apparatus for soldering printed circuit boards includes carriers each adapted for holding a printed circuit board and conveyed successively through a soldering zone to dip each printed circuit board into molten solder contained in a vessel. The vessel is disposed between a pair of laterally spaced apart track members which are engageable two front and two rear wheels of the carrier to support the carrier and the printed circuit board generally in the horizontal state throughout the movement thereof along the track members. Each track member has a first and a second depression at such locations that the two front and the two rear wheels can simultaneously position in the first and second depressions, respectively. Each depression has a depth sufficient to permit the printed circuit board to be dipped into the molten solder when the four wheels travel therealong. A slide rail member engageable by the front and rear wheels is provided adjacent at least one of the track members and is displaced so as to prevent the front wheels and rear wheels from travelling along the second and first depressions, respectively.

5 Claims, 12 Drawing Figures

F I G. 8
(a) 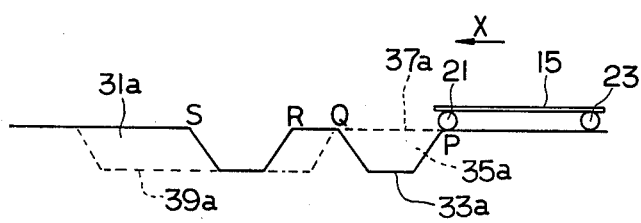
(b) 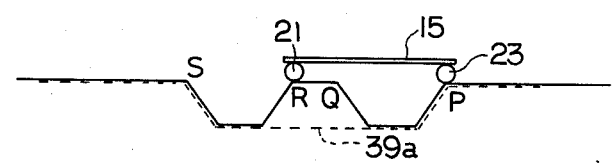
(c) 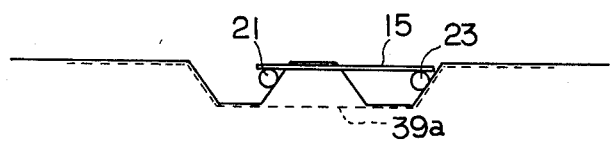
(d) 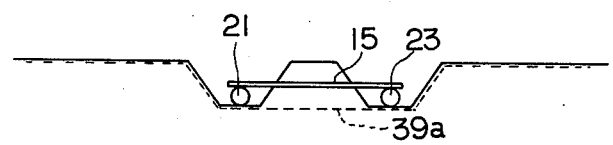
(e) 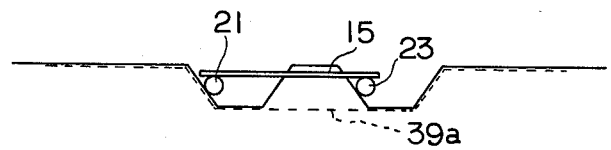
(f) 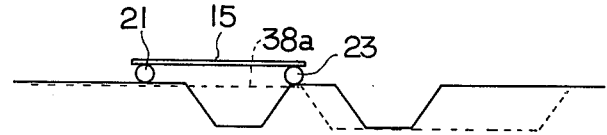
(g) 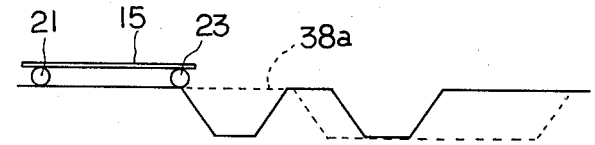

(a)

(b)

(c)

(d)

(e)

(f)

(g)

APPARATUS FOR SOLDERING PRINTED CIRCUIT BOARDS

BACKGROUND OF THE INVENTION

This invention relates generally to an apparatus for automatically applying solder to a printed circuit board having electrical parts mounted thereon, and more particularly to an apparatus for transferring such printed circuit board for contact with molten solder contained in a container.

FIG. 1 of the accompanying drawings shows a conventional soldering apparatus of this sort, in which a printed circuit board 2 with electrical parts 1 is detachably mounted on a carrier 3 which has its front and rear wheels 4 and 5 on a rail 6. The carrier 3 is driven by a conveyor chain (not shown) to run on and along the rail 6. The rail 6 is provided with a sunken portion, at which the lower side of the printed circuit board 2 is dipped in molten solder in a vessel 7 to solder the electrical parts 1 thereto while the carrier 3 travels from point F to G.

In this apparatus, in order to guide the printed circuit board 2 into the solder vessel, it is necessary to introduce the fore end of the printed circuit board 2 into the solder vessel while its rear portions are still going down the slope EF. Therefore, the sunken portion EH must have a large distance with a long slope of an easy grade between the points E and F and G and H. In addition, the solder vessel 7 is required to have a large length in the direction of travel of the carrier 3. As a result, there arise problems such as the increased size of the apparatus as a whole, the needs for a larger amount of molten solder and for a greater amount of heat for maintaining the solder in molten state.

BRIEF SUMMARY OF THE INVENTION

It is therefore an object of the present invention to provide an apparatus for soldering a printed circuit board, which will overcome the above-mentioned problems.

It is another object of the present invention to provide an apparatus for bringing a printed circuit board into contact with molten solder in a solder bath, guiding the printed circuit board on a carrier through a shortened path of travel.

It is still another object of the present invention to provide an apparatus capable of soldering a printed circuit board with the use of a solder vessel of a minimized size.

A further object of this invention is to provide a soldering apparatus which allows adjustment of contact period of time to the desired value.

It is yet a further object of this invention to provide a soldering apparatus which can prevent gases from entering into the contact portion between the printed circuit board and the molten solder.

BRIEF DESCRIPTION OF THE DRAWINGS

Other objects, features and advantages of the present invention will become apparent from the detailed description of the invention, which follows, when considered in light of the accompanying drawings, in which:

FIG. 8 is a side elevational view diagrammatically showing the operation of the slidable rail of the apparatus of this invention.

DETAILED DESCRIPTION OF THE INVENTION

Figure 1:
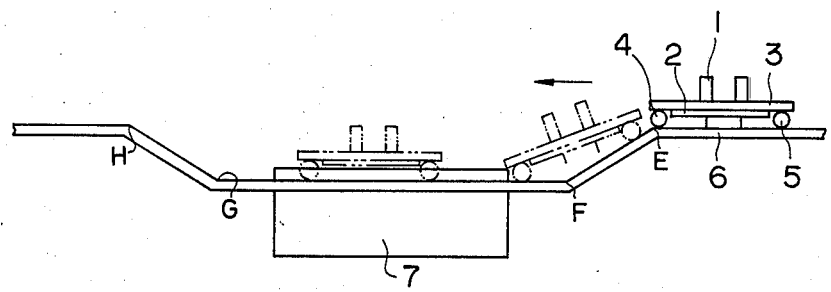
FIG. 1 is a side elevational view diagrammatically showing a conventional apparatus for soldering printed circuit boards.
Figure 2:
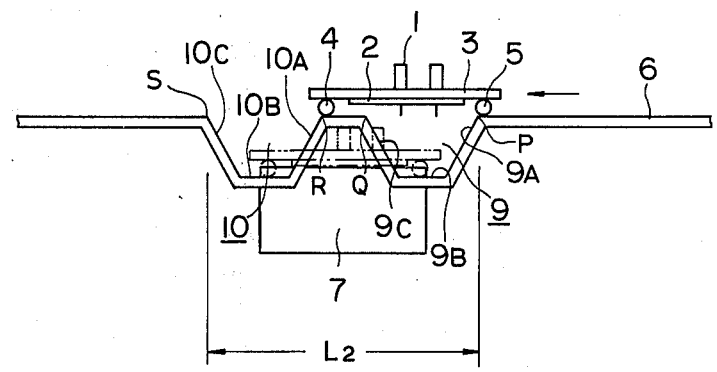
FIG. 2 is a side elevational view explanatory of operating principles of the soldering apparatus according to the present invention.

Referring first to FIG. 2 which shows the principles on which the apparatus of the invention operates, the reference numerals 1 to 7 indicate the same component parts as indicated by similar reference numerals in FIG. 1 except that the rail 6 is provided with two recesses or depressions 9 and 10 one between points P and Q and the other between points R and S. The depressions 9 and 10 are constituted respectively by descending portions 9A and 10A, flat portions 9B and 10B, and ascending portions 9C and 10C. As the carrier 3 is driven to travel on the rail 6 in the direction shown by the arrow, it can reach, by the action of a means described hereinafter, the position indicated by solid line in a horizontal state, with its front wheel 4 at the point R and its rear wheel 5 at the point P (the movement of the front wheels from the point P to the point Q will be hereinafter referred to as "carrier movement through a pre-dipping section"). If the carrier is further advanced in that state, the front and rear wheels 4 and 5 run down the descending portions 9A and 10A onto the flat portions 9B and 10B, respectively, lowering the printed circuit board 2 in horizontal state. At this location (shown by two dotted line), the printed circuit board is brought to the lowest level to have the terminations or lead wires of the electrical parts 1 and the printed circuit on its lower side dipped in the solder in a vessel 7. The carrier 3 is driven continuedly (or after a pause) by the conveyor chain to advance horizontally along the flat portions 9B and 10B and then upwardly along the ascending portions 9C and 10C. During this ascending movement, the printed circuit board 2 is maintained in horizontal state (the movement of the front wheel 4 from point R to point S or of the rear wheel 5 from point P to point Q will be hereinafter referred to as "movement through processing section"). As the carrier 3 is further advanced, the rear wheel 5 passing from point R to S without dropping into the depression 10, while holding the carrier in horizontal state by the function of the means which will be described hereinafter (the movement of the rear wheel 5 from point R to S will be referred to as "movement of the carrier through a post-dipping section").

The above-described arrangement requires only a short transfer passage in soldering a printed circuit board 2 which is supported on a carrier 3.

Figure 3:
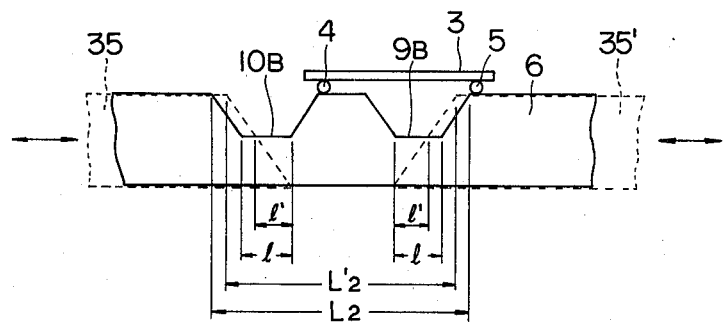
FIG. 3 is a side elevational view schematically showing the operating principles of the mechanism for controlling soldering time according to this invention.

In the foregoing arrangement, the period of time for which the printed circuit board is kept contact with the molten solder depends solely on the length of the flat portions 9B and 10B if the displacing speed of the carrier 3 is kept unaltered. In another aspect of this invention, there is provided an apparatus in which the moved distance of the wheels 4 and 5 on the flat portions 10B and 9B can be changed at will to obtain the optimum contact time according to the kind of printed circuit boards to be soldered. FIG. 3 illustrates the principle of such embodiment. Two separate slide rails 35 and 35' are provided adjacent the rail 6. By shifting these slide rails 35 and 35' in either directions, for example from the state shown by solid line to the state shown by broken line, the length of the flat portions 9B and 10B can be changed, for example from 1 to 1'. As a result, the contact time is changed (shortened, in the illustrated case), even when the carrier 3 passes through the processing section at the same speed.

Figure 4:
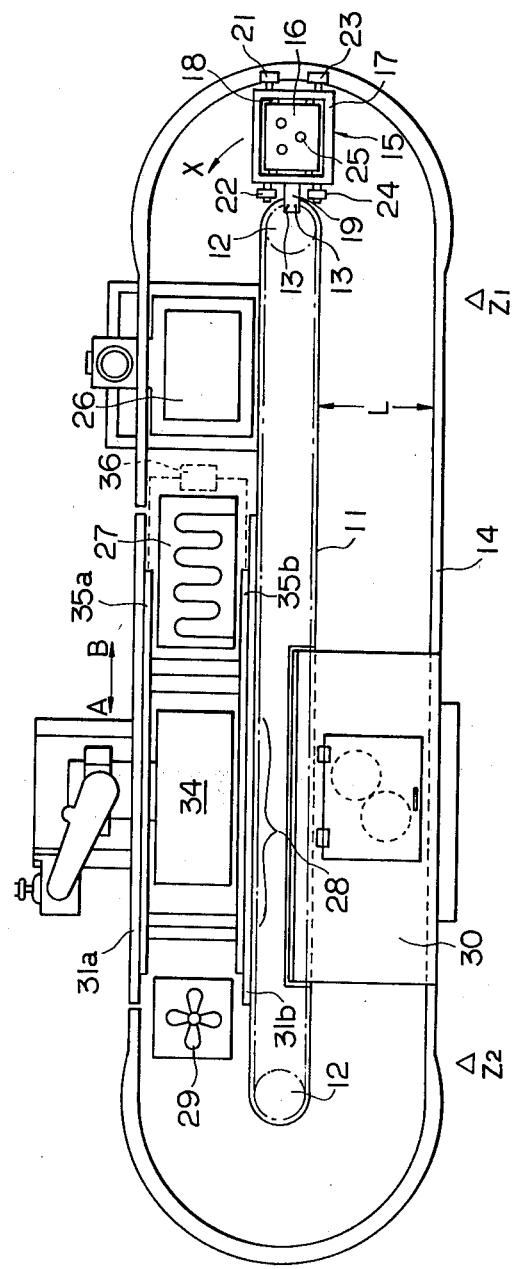
FIG. 4 is a plan view diagrammatically showing a first embodiment of the soldering apparatus according to the invention.

Referring to FIG. 4 which shows in plan view one embodiment of the soldering apparatus according to the instant invention, an endless conveyor chain indicated at 11 is put around a pair of spacedly positioned sprocket wheels 12 which are provided on a base (not shown). One of the sprocket wheels 12 is driven to turn the conveyor chain 11 constantly therearound. Carriers which will be described hereinlater are transferred by the rotation of the conveyor chain 11 which is planted with a multiplicity of pins 13 of suitable length for engagement with the carriers. Designated at 14 is a transfer rail in the form of a loop which is fixed on the base at a predetermined distance L from the conveyor chain 11.

Figure 5A:
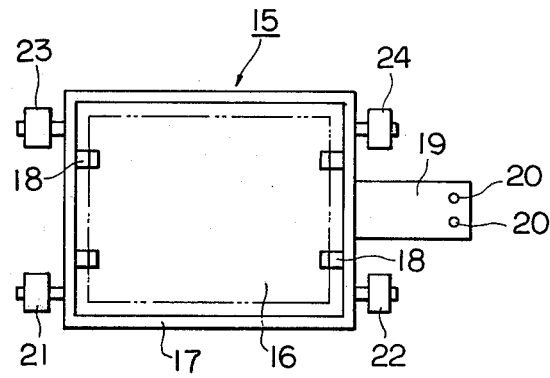
FIG. 5(a) is a plan view diagrammatically showing the carrier in FIG. 4.
Figure 5B:
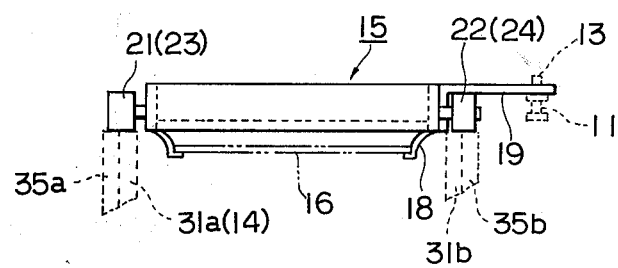
FIG. 5(b) is an elevational view of FIG. 5(a)

FIGS. 5(a) and 5(b) show respectively in plan and side views a carrier 15 which supports a printed circuit board 16 for movement therewith along the transfer rail 14. The carrier 15 includes a frame 17 which is provided with inwardly biased springs 18 at lower opposite sides thereby to hold the printed circuit board 16 therebetween. The frame 17 has at one side a holder strip 19 with perforations 20 adapted to engage pins 13 on the conveyor chain 11. At the opposite side away from the locking strip 19, the frame 17 is provided with first front and rear wheels 21 and 23 which are preferably located in two symmetrical positions relative to the center line of the carrier 15 on the rail 14.

Referring again to FIG. 4, a printed circuit board 16 with electrical parts 25 to be soldered is mounted on the carrier 15 at the position $Z_1$. The printed circuit board 16 on the carrier 15 is conveyed along a predetermined looped transfer path by the conveyor chain 11.

A number of processing zones are located in the transfer path. The carrier 15 which has started from the point $Z_1$ is passed through a flow-dip fluxer zone 26 to apply flux to the printed circuit board 16 and then through a preheating zone 27 to heat the printed circuit board 16 before sending same to a soldering zone 28 including a solder vessel 34. Thereafter, the carrier 15 is sent to a cooling zone 29 where the printed circuit board 16 is cooled, for example, by a fan and then to a cutter section 30 to cut off the lead wires depending from the printed circuit board 16. The printed circuit board 16 is transferred again through the fluxer zone 26 and preheating zone 27 to the soldering zone 28 to give a finish to the soldering. After being passed through the cooling zone 29, the printed circuit board 16 is removed from the carrier 15 at the position $Z_2$. Although only one carrier 15 is referred to in the foregoing description, it is to be understood that a number of carriers with their printed circuit boards are fixed at suitable intervals on the conveyor chain 13 by pins 13 to process the printed circuit boards successively.

Figure 6:
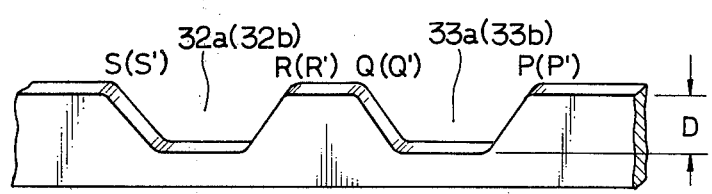
FIG. 6 is a perspective view showing the auxiliary rail of FIG. 4.

The present invention provides an improvement in such printed circuit board processing apparatus. Referring continuously to FIG. 4, the transfer rail 14 is disconnected at the soldering zone 28 and instead provided with an auxiliary rail (or a first track member) 31a. As shown particularly in FIG. 6, the auxiliary rail 31a has a first depression 32a between the points R and S and a second depression 33a between the points P and Q which perform the same functions as the depressions 10 and 9, respectively, of FIG. 2. On the other side of the solder vessel 34 opposite to the auxiliary rail 31a, there is provided a similar auxiliary rail (or a second track member) 31b which has a first depression between points R' and S' and a second depression 33b between points P' and Q'. As seen in FIG. 5(a), second front and rear wheels 22 and 24 are provided on the side of the holder strip preferably opposite the first front and rear wheels 21 and 23. The second front and rear wheels 22 and 24 run on and along the auxiliary rail 31b in the soldering zone 28.

When the carrier 15 moves through the soldering zone, if the front wheels 21 and 22 do not drop into the depressions 33a and 33b of the auxiliary rails 31a and 31b, it can pass through the pre-dipping section in horizontal state. As the carrier 15 moves through the processing section, it is lowered in horizontal state by a distance corresponding to the depth D of the first and second depressions and then raised to the initial level. When the carrier 15 is lowered by the distance D, the underside of the printed circuit board 16 on the carrier is contacted with molten solder in the solder vessel 34 which is placed between the auxiliary rails 31a and 31b. The conveyor chain 11 is lowered in the soldering zone 28 so that the carrier 15 is engaged and supported solely by the auxiliary rails 31a and 31b at least during its descending and ascending movement, that is to say, at least during the movement through the processing section. Moreover, if the carrier 15 is further advanced without dropping its paired rear wheels 23 and 24 in the first depressions 32a and 32b, it can pass through the post-dipping section in horizontal state.

In order to pass the carrier 15 in horizontal state through the pre- and post-dipping sections, first and second slide rails 35a and 35b are slidably provided in positions adjacent to the auxiliary rails 31a and 31b, respectively. Indicated at 36 is a drive unit by which the first and second slide rails 35a and 35b are simultaneously displaced by predetermined distances at predetermined timing.

As shown in FIG. 5(b), the first front and rear wheels 21 and 23 have a sufficient width in the axial direction of the respective axles to be engageable with both the first auxiliary rail 31a and the first slide rail 35a. Similarly, the second front and rear wheels 22 and 24 have a sufficient width for engagement with both the second auxiliary rail 31b and the second slide rail 35b.

Figure 7:
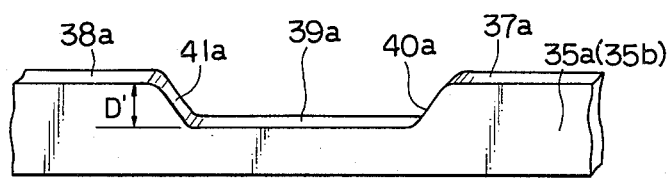
FIG. 7 is an elevational view explanatory of the function of the slidable rail in FIG. 4.

The slide rail 35a has, as shown in FIG. 7, first and second guide track portions 37a and 38a of a length equivalent to or greater than the distance between the points P and Q (or R and S) and a depression 39a between the just-mentioned first and second guide track portions 37a and 38a. The depression 39a has a depth D' which is equivalent to or greater than the depth D of the depression 32a (33a) on the auxiliary rail 31a. Moreover, the depression 39a is formed to have a length equivalent to or greater than the distance between the points P and S in order not to impede the running movement of the front and rear wheels 21 and 23 of the carrier 15 in the depressions 32a and 33a of the auxiliary rail 31a. The slopes 40a and 41a of the depression 39a have the same gradient as the slopes of the depression on the auxiliary rail 31a (the slopes 9A and 10C in FIG. 2). The second slide rail 35b has the same construction as the first slide rail 35a.

Figure 9:
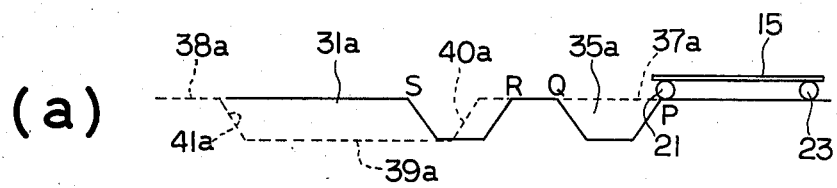
FIG. 9 is a view, similar to FIG. 8, showing another operation of the slidable rail.
Figure 9:
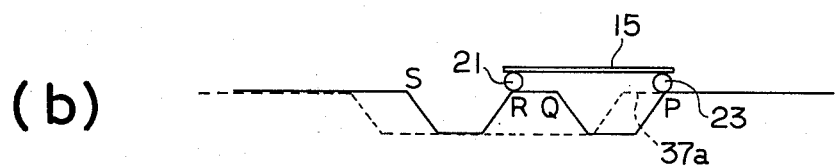
Figure 9:
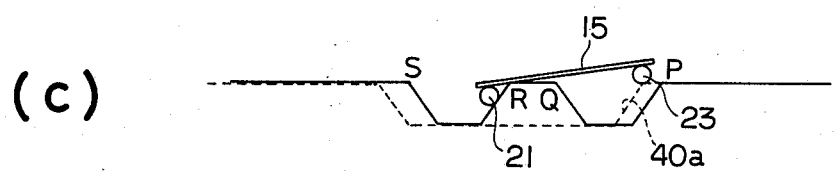
Figure 9:
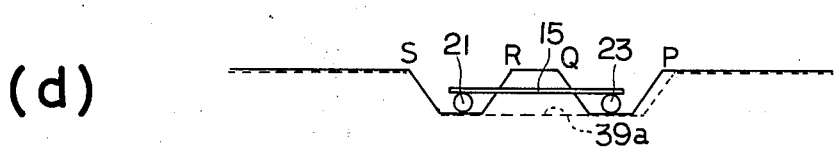
Figure 9:
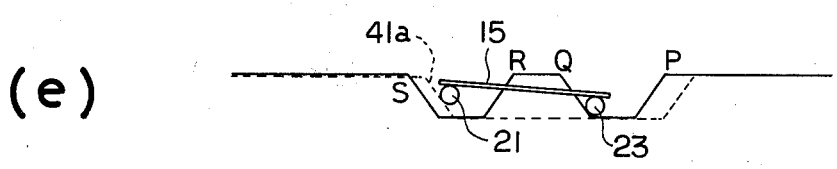
Figure 9:
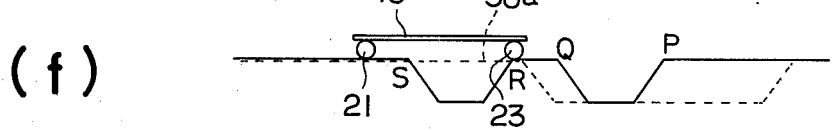
Figure 9:
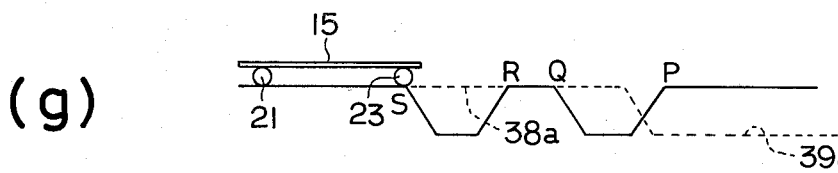

The operation of the above-described soldering apparatus is now described with reference to FIGS. 8 and 9. Although in actual operation the two front wheels 21 and 22 and the two rear wheels 23 and 24 are guided by the auxiliary rails 31a and 31b on opposite sides of the solder vessel 34 for lowering and lifting the carrier 15, the following description deals only with the operations performed by one of the paired component parts, namely, the operations performed by the outer auxiliary rail 31a, and the outer slide rail 35a. In FIGS. 8 and 9, the auxiliary rail 31a is indicated by solid line and the slide rail 35a by broken line.

Referring to FIG. 8, before the front wheel 21 of the carrier 15 which is moving on the transfer rail 14 toward the auxiliary rail 31a in the direction of arrow X reaches the point P, the slide rail 35a is slided into the position of FIG. 8(a) where its first guide track portion 37a bridges the points P and Q of the auxiliary rail 31a. Therefore, the front wheel 21 runs on the first guide track portion 37a of the slide rail 35a without dropping into the second depression 33a and reaches the point Q.

While the carrier passes through the pre-dipping section and its front wheel 21 runs from the point Q to R, the drive unit 36 is actuated to move the slide rail 35a into the position of FIG. 8(b) where the first and second depressions 32a and 33a of the auxiliary rail 31a are located abreast with the depression 39a of the slide rail 35a. As a result, the front and rear wheels 21 and 23 are respectively guided by the first and second depressions 32a and 33a of the auxiliary rail 31a during the succeeding forward movement of the carrier 15 to let the printed circuit board on the carrier 15 undergo the soldering treatment (FIGS. 8(c) to 8(e)).

When the front wheel 21 reaches the point S or when the rear wheel 23 reaches the point Q, the drive unit 36 is actuated again to shift the slide rail 35a to the position of 8(f) before the rear wheel 23 comes to the point R, bridging the first depression 32a by the second guide track portion 38a of the slide rail 35a. This permits the rear wheel 23 to be guided by the second guide track portion 38a without dropping into the first depression 32a during the succeeding forward movement of the carrier 15 to reach the point S (FIG. 8(g)). Thereafter, the slide rail 35a is driven to return to the position of FIG. 8(a), waiting for the next printed circuit board to be processed.

In the foregoing description, the slide rail 35a is explained as being stopped when the carrier 15 is passing through the pre- and post-dipping sections. However, in a case where the slide rail has suitably elongated first and second guide track portions, it may be continuedly put in sliding movement while the carrier 15 is passing through the pre- and post-dipping sections. Further, by forming the depression 39a to have a sufficient length, the slide rail 35a can be continuedly displaced while the carrier is travelling through the processing section.

FIG. 9 shows an embodiment in which the time period of contact between the printed circuit board and the molten solder is shortened as compared with the embodiment of FIG. 8.

When the carrier 15 is transferred onto the auxiliary rail 31a and reaches the position of FIG. 9(a), this is detected by a suitable detecting means (not shown), for example, by a limit switch which is located in a predetermined position, actuating the drive unit 36 (FIG. 4) to move the slide rail 35a continuously in the following manner. While the front wheel 21 of the carrier 15 is moving between the points P and Q on the auxiliary rail 31a, the slide rail 35a is moved to bridge the second depression 33a of the auxiliary rail 31a by its first guide track portion 37a. This allows the carrier 15 to pass through the pre-dipping section in horizontal state, its front wheel 21 reaching the point R (FIG. 9(b)). As the carrier 15 advances further, the front wheel 21 is dropped into the first depression 32a of the auxiliary rail 31a, guided by its descending slope, but at this time the rear wheel 23 is still on the first guide track portion 37a of the slide rail 35a (FIG. 9(c)). It is when the front wheel 21 reaches the bottom of the first depression 32a that the rear wheel 23 comes to the slope 40a of the depression 39a on the slide rail 35a. Thus, the printed circuit board is contacted with the molten solder from its fore end. Upon further movement of the carrier 15, the front and rear wheels 21 and 23 are respectively brought to the bottoms of the first and second depressions 32a and 33a of the auxiliary rail 31a, as shown in FIG. 9(d). As a result, the printed circuit board 16 is moved in horizontal state, having the entire area of its underside contacted with the molten solder. While the rear wheel 23 is still at the bottom of the depression 33a, the slide rail 35a is shifted to the position of FIG. 9(e) so that the front wheel 21 of the carrier 15 is firstly guided by the slope 41a of the slide rail 35a. Thus, the printed circuit board is lifted from its fore end in rearwardly tilted state, inverse to the state of FIG. 9(c), and then returned to horizontal state as soon as its front wheel 21 reaches the point S. When the rear wheel 23 reaches the point R by further movement of the carrier 15 as shown in FIG. 9(f), the second guide track portion 38a is located to bridge the points R and S of the first depression 32a. Therefore, the rear wheel 23 is guided by the second guide track portion of the slide rail 35a without dropping into the depression 32a on the auxiliary rail 31a, allowing the carrier 15 to pass through the post-dipping section in horizontal state (FIG. 9(g)). Thereafter, the slide rail 35a is returned to the state as shown in FIG. 9(a). In this manner, the printed circuit board 16 is processed with a shorter contacting time than in the embodiment of FIG. 8. The slide rail 35a which is described as being continuedly driven in the embodiment of FIG. 9 may be moved either at a constant speed or at a variable speed. If desired, the slide rail 35a may be driven intermittently or stepwise in a predetermined timing as long as it can assume the afore-mentioned positions in relation with the movement of the carrier 15.

Figure 10:
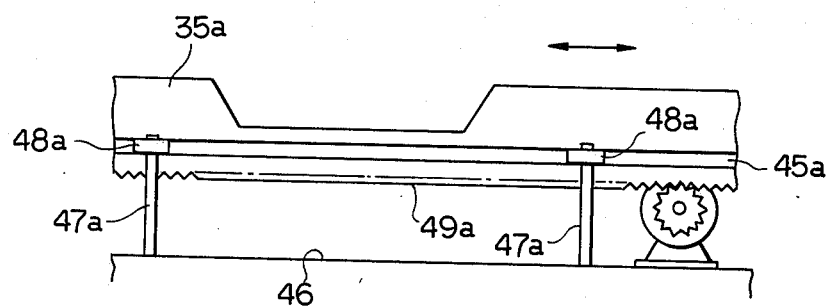
FIGS. 10 and 11 show an example of the driving means for displacing the slide rails.
Figure 11:
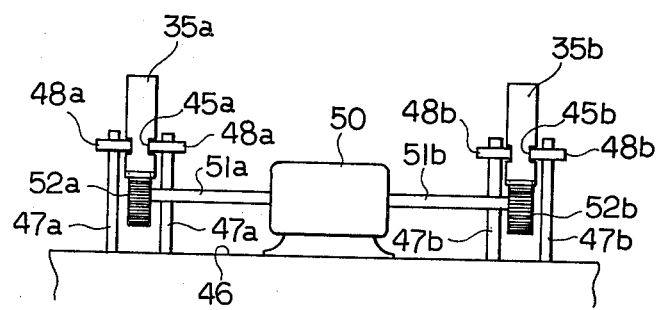

FIGS. 10 and 11 show an example of the driving means 36 for displacing the slide rails 35a and 35b. The slide rails 35a and 35b are provided with grooves 45a and 45b, respectively, at their both sides. Guide rollers 48a and 48b are rotatably mounted to supporting rods 47a and 47b and engage the grooves 45a and 45b, respectively. The rods 47a and 47b are fixed to a base 46 so that the slide rails 35a and 35b can be slidable in their longitudinal directions and prevented from moving in other directions. The slide rails 35a and 35b are at their undersides formed with racks 49a and 49b which mesh pinions 52a and 52b, respectively. The pinions 52a and 52b are fixed to driving shafts 51a and 51b of a step motor 50, respectively. By driving the step motor 50, the pinions 52a and 52b are rotated to simultaneously displace the slide rails 35a and 35b. The step motor 50 is subject to the control of a controller unit (not shown) so as to displace the slide rails 35a and 35b at a predetermined timings, in predetermined distances and toward predetermined directions.

As shown in FIG. 9, by the operation of the slide rail 35a, the printed circuit board is caused to contact the molten solder initially from its fore end and, after an overall contact, its rear end is belatedly detached from the solder surface, making the so-called pitching motion. The pitching motion is desirable for the soldering operation since it contributes to dispel the air bubbles which otherwise cause incomplete contact by creeping into the contacting plane between the printed circuit board and the molten solder, and to get rid of unnecessary solder at the time of detachment therefrom. The inclination of the carrier 15 can be varied by changing the shift position of the slide rail 35a.

In the foregoing embodiment, a pair of slide rails 35a and 35b which are provided on the inner side of the auxiliary rails 31a and 31b on the opposite sides of the solder vessel 34 are driven in synchronism with each other. However, similar operation can be obtained by employing only one slide rail at one side of the outer auxiliary rail 31b. In such a case, the carrier 15 is supportingly engaged by the transfer chain 11 on the side of the auxiliary rail 31b through the holder strip 19, thereby preventing the carrier 15 from dropping into the depressions when passing through the pre- and post-dipping sections. The outer auxiliary rail 31a which is located in the disconnected void portion of the transfer rail 14 may not necessarily be formed separately from the latter. In other words, the auxiliary rail 31a may be integrated into the transfer rail 14 at a predetermined position along the length thereof.

Further, the foregoing embodiment employs the front and rear wheels with wide treads which are engageable with both the auxiliary and slide rails. However, it is possible to engage the front and rear wheels only with the auxiliary rails, providing additional wheels on the carrier for engagement with the slide rails.

The invention may be embodied in other specific forms without departing from the spirit or essential characteristics thereof. The present embodiments are therefore to be considered in all respects as illustrative and no restrictive, the scope of the invention being indicated by the appended claims rather than by the foregoing description, and all the changes which come within the meaning and range of equivalency of the claims are therefore intended to be embraced therein.

What is claimed is:

1. An apparatus for soldering a printed circuit board, comprising:
    a carrier adapted to support a printed circuit board thereon;
    first front and rear wheel members mounted at one side of said carrier;
    second front and rear wheel members mounted at the other side of said carrier;
    a pair of laterally spaced first and second track members adapted for supporting said carrier thereon, said first track member being engageable with said first front and rear wheel members of said carrier and said second track member being engageable with said second front and rear wheel members;
    a solder vessel containing molten solder and located between said first and second track members;
    drive means for displacing said carrier along said first and second track members and supportingly engageable with a part of said carrier on said one side thereof;
    said first and second track members each having first and second depressions of the same depth formed at positions to be met simultaneously by said first and second front and rear wheel members of said carrier;
    said first and second depressions having a length and a depth sufficient to allow the underside of said printed circuit board on said carrier to be brought into contact with the molten solder in said solder vessel when said first and second front and rear wheel members are moving along said first and second depressions;
    a first rail means slidably located parallel with said first track member and having a guide track portion supportingly engageable with said first front and rear wheel members; and
    means for driving said first rail means such that said first front and rear wheel members are guidingly engaged by said guide track portion when said first front wheel member and said second rear wheel member are passing respectively through said second and first depressions and that said first front and rear wheel members are engageable with at least part of said first and second depressions to contact said printed circuit board on said carrier with the molten solder in said solder vessel.

2. An apparatus as defined in claim 1, wherein said first front and rear wheel members are in the form of a first common front wheel and a first common rear wheel which are engageable with both said first track member and said guide track portion of said first rail means.

3. An apparatus as defined in claim 1 or 2, further comprising a second rail means slidably located parallel with said second track member and having a guide track portion supportingly engageable with said second front and rear wheels, said second rail means being driven by said drive means in synchronism with said first rail means.

4. An apparatus as defined in claim 3, wherein said second front and rear wheel members are in the form of a second common front wheel and a second common rear wheel which are engageable with both said second track member and said guide track portion of said second rail means.

5. An apparatus as defined in claim 2, wherein said first and second rail means each has first and second guide track portions defining therebetween a depression of a depth equivalent to or greater than that of said first and second depressions.

* * * * *